(12) United States Patent
Parkhe

(10) Patent No.: US 6,853,533 B2
(45) Date of Patent: Feb. 8, 2005

(54) FULL AREA TEMPERATURE CONTROLLED ELECTROSTATIC CHUCK AND METHOD OF FABRICATING SAME

(75) Inventor: Vijay D. Parkhe, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 497 days.

(21) Appl. No.: 09/881,979

(22) Filed: Jun. 13, 2001

(65) Prior Publication Data

US 2002/0050246 A1 May 2, 2002

Related U.S. Application Data

(60) Provisional application No. 60/210,891, filed on Jun. 9, 2000.

(51) Int. Cl.[7] .............................................. H01T 23/00
(52) U.S. Cl. ..................................................... 361/234
(58) Field of Search .................... 361/234; 279/128; 29/829, 825; 118/500, 725, 728

(56) References Cited

U.S. PATENT DOCUMENTS

| 5,228,501 A |   | 7/1993 | Tepman et al. ............. 165/80.1 |
| 5,511,799 A |   | 4/1996 | Davenport ................... 277/236 |
| 5,535,090 A | * | 7/1996 | Sherman ...................... 361/234 |
| 5,656,093 A |   | 8/1997 | Burkhart et al. ............ 118/728 |
| 5,810,933 A |   | 9/1998 | Mountsier et al. .......... 118/724 |
| 5,861,086 A |   | 1/1999 | Khurana et al. ....... 204/192.32 |

* cited by examiner

Primary Examiner—Brian Sircus
Assistant Examiner—James A Demakis
(74) Attorney, Agent, or Firm—Moser, Patterson & Sheridan LLP

(57) ABSTRACT

A semiconductor wafer support assembly and method of fabricating the same are provided. In one embodiment, the method and resulting assembly include attaching a pedestal joining-ring to a bottom surface of a ceramic puck. Low temperature brazing a composite cooling plate structure to the bottom surface of the ceramic puck, where the pedestal joining-ring circumscribes the composite cooling plate structure. Thereafter, a pedestal is electron-beam welded to the pedestal joining-ring.

69 Claims, 8 Drawing Sheets

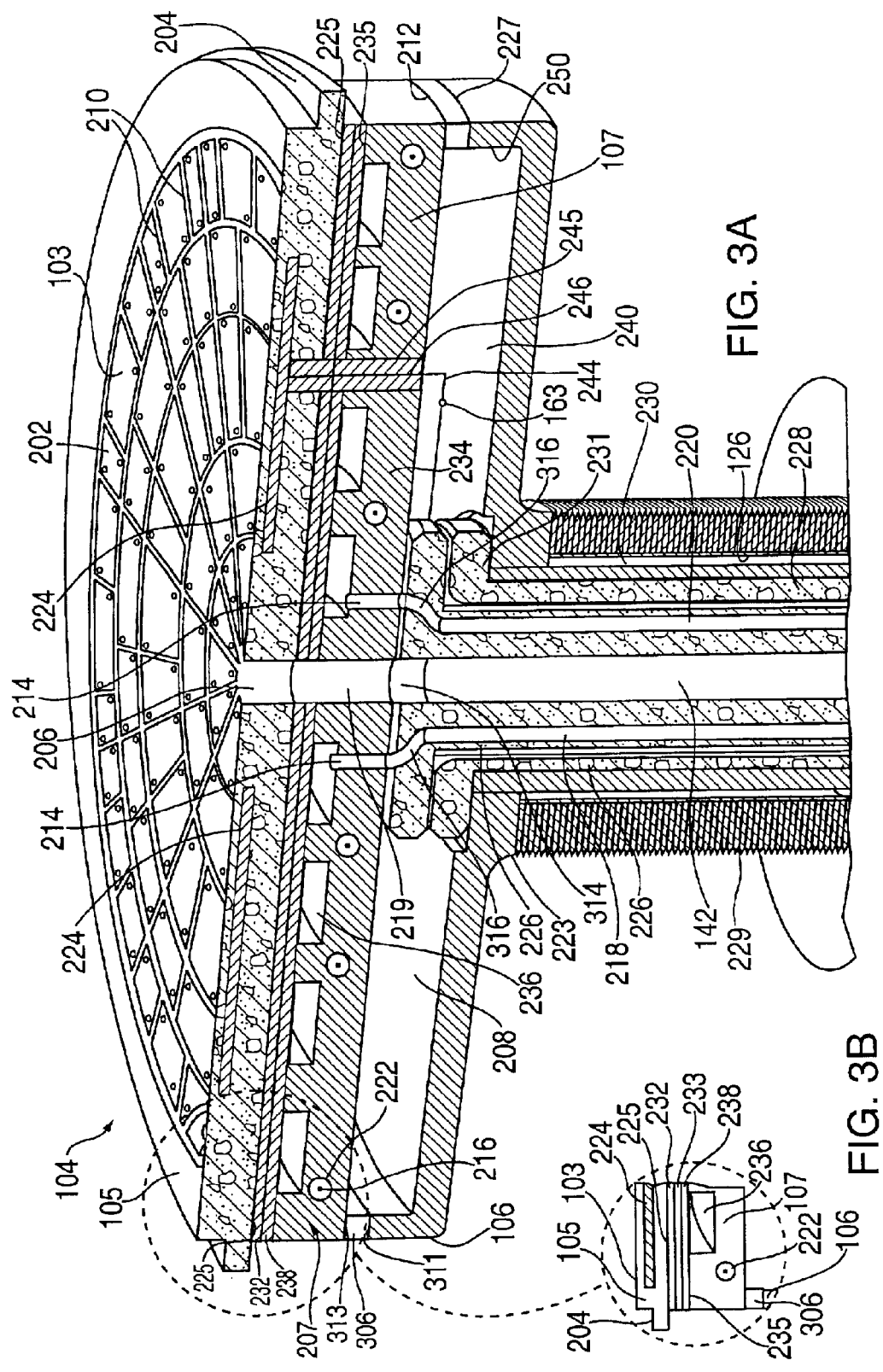

FULL AREA TEMPERATURE CONTROLLED ELECTROSTATIC CHUCK AND METHOD OF FABRICATING SAME

CROSS-REFERENCES

This application claims benefit of U.S. Provisional Application No. 60/210,891, filed Jun. 9, 2000, which is hereby incorporated by reference in its entirety.

BACKGROUND OF THE INVENTION

1. Field of the Invention

The invention relates generally to an apparatus for retaining a workpiece on a workpiece support within a semiconductor wafer processing system and, more specifically, to an improved three piece wafer support assembly for retaining and temperature regulating large diameter (300 mm or more) semiconductor wafers.

2. Description of the Background Art

In semiconductor wafer processing equipment, electrostatic chucks are commonly used for clamping 200 millimeter (mm) wafers to a pedestal during processing. Electrostatic chucks typically clamp a workpiece (i.e., a semiconductor wafer) by creating an electrostatic attractive force between the wafer and the chuck. A voltage is applied to one or more electrodes in the chuck so as to induce oppositely polarized charges in the wafer and electrodes, respectively. The opposite charges pull the wafer against the chuck, thereby retaining the wafer. For example, in a physical vapor deposition (PVD) chamber a 200 mm wafer is electrostatically clamped to an electrostatic chuck disposed of a wafer support assembly, to ensure that the wafer is stationary and temperature regulated during processing.

Increased demand for 200 mm wafers led to improvements in chuck construction and features for processing this size workpiece. This resulted in higher wafer yield, better temperature control during wafer processing, and an overall better quality product. The latest generation of semiconductor wafers has a diameter of 300 mm, which accommodate fabrication of even more integrated circuit components on a single wafer. Unfortunately, the larger size wafers and smaller device dimensions carry with them their own set of production problems.

For example, wafer processing temperatures as low as −60° C. may be required. As such, a larger thermal transfer element (e.g., cooling plate) is required to provide adequate cooling of a 300 mm wafer during processing. Additionally, maintaining adequate and uniform thermal conductivity between the thermal transfer element and the backside of the wafer at any operating temperature is desirable. For example, during pre-wafer process bake-out of the chamber and electrostatic chuck (i.e., to remove excess moisture) the entire electrostatic chuck should be uniformly heated to completely remove moisture and any other potential contaminants.

One solution was to develop a two-piece assembly whereby the chuck and thermal transfer element are individual components and capable of operating at low processing temperatures. In two piece assemblies, the chuck portion resembles a disk-like portion and is commonly referred to as a puck. Usually the puck and thermal transfer element are fabricated from different materials. For example, the puck is fabricated from a ceramic puck (e.g., AlN), while the thermal transfer portion (i.e., cooling plate) is illustratively fabricated from molybdenum or molybdenum alloy, KOVAR®, or a metal matrix composite ($Al_xSi_ySiC$). These materials are joined together by brazing. However, brazing temperatures cause thermal expansion to occur at the surface being brazed, which may result in deformation of the puck and cooling plate. For example, the support surface is designed to operate at temperatures in the range of −60° C. to 50° C., and a bake out process occurs in a temperature range of 100° C. to 350° C. As such, the bake out temperature range puts stringent conditions on the types of materials a manufacturer may use to build the electrostatic chuck assembly. In particular, conventional bonding techniques, such as using an Indium alloy, are not reliable in this temperature range due to a low melting point of 156° C. for indium.

Additionally, at extreme operating temperatures, differential thermal expansions of the wafer support assembly components occur. In particular, under thermal load, a material will change shape proportional to the amount of temperature change multiplied by its coefficient of thermal expansion. The coefficient of thermal expansion indicates how much a material shape will change for each degree of temperature change. Typically, a ceramic puck, such as aluminum nitride (AlN), has a thermal expansion coefficient of approximately $5 \times 10^{-6}$ per degrees C., while stainless steel has a coefficient of thermal expansion of approximately $17 \times 10^{-6}$ per degrees C. As such, the ceramic puck will expand approximately 3 times less as a similarly sized stainless steel part. When he aluminum nitride and stainless steel are joined together, such thermal expansion differentials may quickly lead to stress and cracking.

Another problem is in an instance where molybdenum is used to fabricate the cooling plate. In particular, molybdenum cannot be easily welded to a metal such as stainless steel, aluminum, and the like. Welding molybdenum to stainless steel requires the welding to be performed in a vacuum-like environment. As such, manufacturing difficulties arise when welding a molybdenum cooling plate to a stainless steel pedestal. Furthermore, welding at high temperatures may cause the molybdenum cooling plate to become brittle, thereby increasing susceptibility to fatigue and cracking. Moreover, contaminants may form and combine with the weld, thereby weakening the strength of the bond.

Therefore, there is a need in the art for a low processing temperature 300 mm puck and thermal transfer element assembly and a technique for securely joining the puck, cooling plate, and pedestal. Such devices are necessary to improve temperature uniformity across a wafer, maintain the wafer at specific temperature ranges during processing, and reduce the maintenance and manufacturing costs of the same.

SUMMARY OF THE INVENTION

In one embodiment, the method and resulting assembly include attaching a pedestal joining-ring to a bottom surface of a ceramic puck. Low temperature brazing a composite cooling plate structure to the bottom surface of the ceramic puck, where the pedestal joining-ring circumscribes the composite cooling plate structure. Thereafter, a pedestal is electron-beam welded to the pedestal joining-ring.

In a second embodiment, for a full area temperature controlled assembly, a method and assembly include a ceramic puck having a wafer support surface, and a composite cooling plate structure having a diameter at least equal to the wafer support surface. A pedestal joining-ring is attached to a bottom surface of the composite cooling plate structure. A bottom surface of the ceramic puck is low temperature brazed to the composite cooling plate structure, and then a pedestal is electron-beam welded to the pedestal joining-ring.

In a third embodiment, for a full area temperature controlled semiconductor wafer support assembly, a method and assembly include a ceramic puck having a wafer support surface, and a metal matrix composite cooling plate structure having a diameter at least equal to the wafer support surface. A pedestal joining-ring is low temperature brazed to a bottom surface of the composite cooling plate structure. A bottom surface of the ceramic puck is low temperature brazed to the composite cooling plate structure. Then a pedestal is electron-beam welded to the pedestal joining-ring. These and other aspects of the invention will be more apparent from the following description.

BRIEF DESCRIPTION OF THE DRAWINGS

The teachings of the present invention can be readily understood by considering the following detailed description in conjunction with the accompanying drawings, in which:

FIG. 3A depicts a partial perspective, cross-sectional view of a second embodiment of the workpiece support assembly of the workpiece processing chamber of FIG. 1;

FIG. 3B depicts an enlarged cross-sectional view of a portion of the second embodiment of the workpiece support assembly of FIG. 3A;

To facilitate understanding, identical reference numerals have been used, where possible, to designate identical elements that are common to the figures.

DETAILED DESCRIPTION

Figure 1:
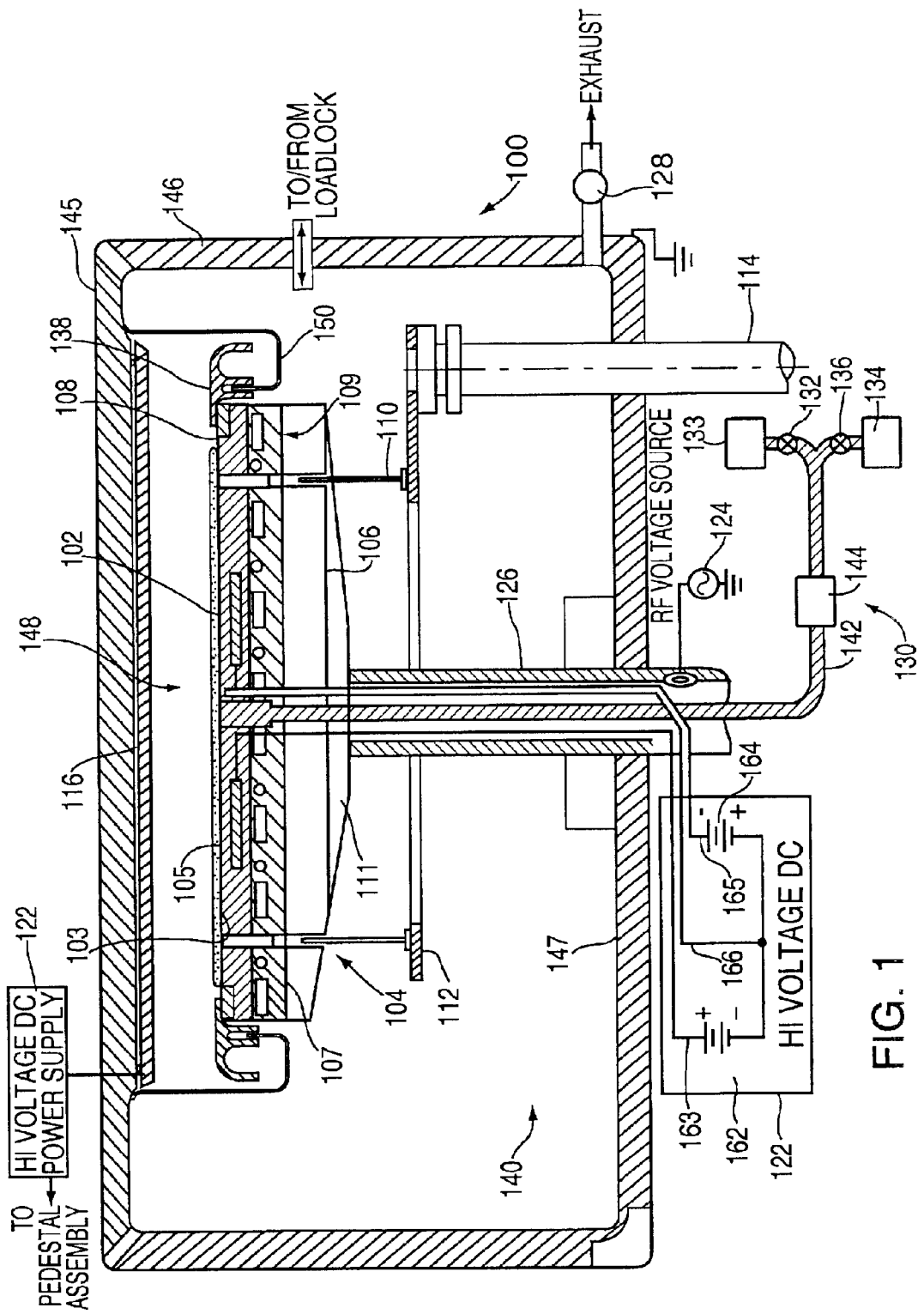
FIG. 1 depicts a partial cross-sectional view of a workpiece processing chamber housing the present invention.

FIG. 1 depicts a partial cross-sectional view of a workpiece processing chamber 100 containing the present invention. The processing chamber 100 comprises a bottom 147, a plurality of walls 146, and a lid 145 to form a vacuum chamber. The processing chamber 100 is illustratively a physical vapor deposition (PVD) processing chamber 100 for processing a workpiece i.e., a semiconductor wafer 102 therein. For a detailed understanding of the PVD processing chamber 100 and its operation in processing a wafer 102, the reader should refer to the drawings and the detailed description contained in commonly assigned U.S. Pat. No. 5,228,501, issued Jul. 20, 1993; and U.S. Pat. No 5,861,086, issued Jan. 19, 1999; which are incorporated herein by reference. These references disclose a 200 millimeter wafer support assembly and a physical vapor deposition chamber manufactured by Applied Materials, Inc. of Santa Clara, Calif. Furthermore, one skilled in the art will recognize that the processing chamber may be any type of chamber for processing a workpiece, such as a chemical vapor deposition (CVD) chamber, etch chamber, and the like.

The wafer 102 is disposed on a novel apparatus for retaining a wafer (e.g., a 200 or 300 mm wafer) against a workpiece support, providing RF biasing to the wafer in a well-defined and insulated path that is internal to the apparatus, and operating in a temperature range of approximately $-60°$ C. to $350°$ C. Specifically, the wafer 102 rests on a support surface 103 of a wafer support assembly 104. The wafer support assembly 104 comprises a chuck assembly 109 disposed on a pedestal 106. The chuck assembly 109 further comprises a puck 105 (illustratively and hereinafter an "electrostatic chuck") and a cooling plate 107. The electrostatic chuck 105 is disposed on the cooling plate 107 to provide temperature regulation of the electrostatic chuck 105. The pedestal 106 is disposed beneath the cooling plate 107 to support both cooling plate 107 and the electrostatic chuck 105. The electrostatic chuck 105, cooling plate 107, and pedestal 106 together form the wafer support assembly 104. A shaft 126 supports the wafer support assembly 104 at a lower portion 111 of the pedestal 106 from the bottom 147 of the chamber 100. The shaft 126 houses the necessary electrical wiring and plumbing to transfer power (e.g., RF and DC) and heat transfer fluids (e.g., gases and liquids) respectively from various remote sources to the wafer support assembly 104. The pedestal 106 and shaft 126 are electrically connected to ground.

Although the puck 105 is discussed as being an electrostatic chuck, it need not be such a device. Alternately, the puck 105 may be a heater used in a chemical vapor deposition (CVD) process system (i.e., having no electrostatic chucking capabilities) or any other type of general-purpose workpiece support in a system requiring RF biasing of the workpiece.

In a physical vapor deposition (PVD) chamber 100, PVD processing is used to deposit a thin film of material on the wafer 102. A target 116 comprising a sputtering or deposition material is positioned over the wafer support assembly 104. The target 116 is electrically insulated from the chamber 100, and may be fabricated from a material such as aluminum, tantalum, titanium, tungsten, or any other material suitable for being deposited as a thin film of the target. The pressure in the chamber 100 is reduced to about $10^{-6}$ to $10^{-10}$ Torr, after which a gas (e.g., argon), is introduced into the chamber 100 to produce a partial pressure ranging between 0.1 mTorr to approximately 20 mTorr.

A remote DC power source 122 (e.g., a high voltage DC power supply) is electrically connected between the target 116 and wafer support assembly 104 for magnetron sputtering of the target 116. Additionally, a RF (radio frequency) voltage source 124 is coupled to the wafer support assembly 104 as explained in greater detail below. In one embodiment, one or more rings such as a waste ring 108 and/or a cover-ring 138, and/or a shield 150 circumscribe the electrostatic chuck assembly 109. The waste ring 108, cover-ring 138, and shield help to prevent unwanted deposition material from accumulating into a lower chamber region 140, as well as provide uniform wafer processing at the edges of the wafer 102.

One of the aforementioned heat transfer fluids is a "backside gas", which is provided from a backside gas delivery system 130. The backside gas is transferred to the backside of the wafer 102 from one or more remote gas sources (e.g., gas sources 133 and/or 134) via a gas conduit 142. The gas conduit 142 extends through the shaft 126 and the wafer support assembly 104. The backside gas flows through the wafer support assembly 104 via the gas conduit 42, to a process cavity 148 located directly above the wafer support assembly 104. The backside gas is used to provide sufficiently even heat transfer by direct conduction between the backside of the wafer 102 and the support surface 103 of the chuck 105. The backside gas is typically helium, argon, hydrogen, carbon tetrafluoride, or any other gas that is a good heat conductor at low pressures. The backside gas is usually applied through channels or grooves (not shown) formed in the support surface 103. The channels or grooves may be formed in concentric circles or any other pattern suitable for evenly distributing the backside gas across the backside area of the wafer 102. Additionally, a cooling fluid and/or one or more heater elements may be disposed within the cooling plate 107 to also provide temperature regulation of the electrostatic chuck 105. These additional temperature regulation devices are further discussed below.

A plurality of lift pins 110 is mounted on a lift pin arm 112, which is connected to a vertical shaft 114. In one embodiment, there are three lift pins 110 disposed 120° from each other. A motor (not shown) powers the vertical shaft 114, which moves the vertical shaft upward and downward. The vertical shaft 114, lift pin arm 112, and plurality of lift pins 110 together serve to lift the wafer 102 off the support surface 103 after processing, whereupon a robotic arm (not shown) removes the wafer 102 from the chamber 100.

Figures 2A, 2B:
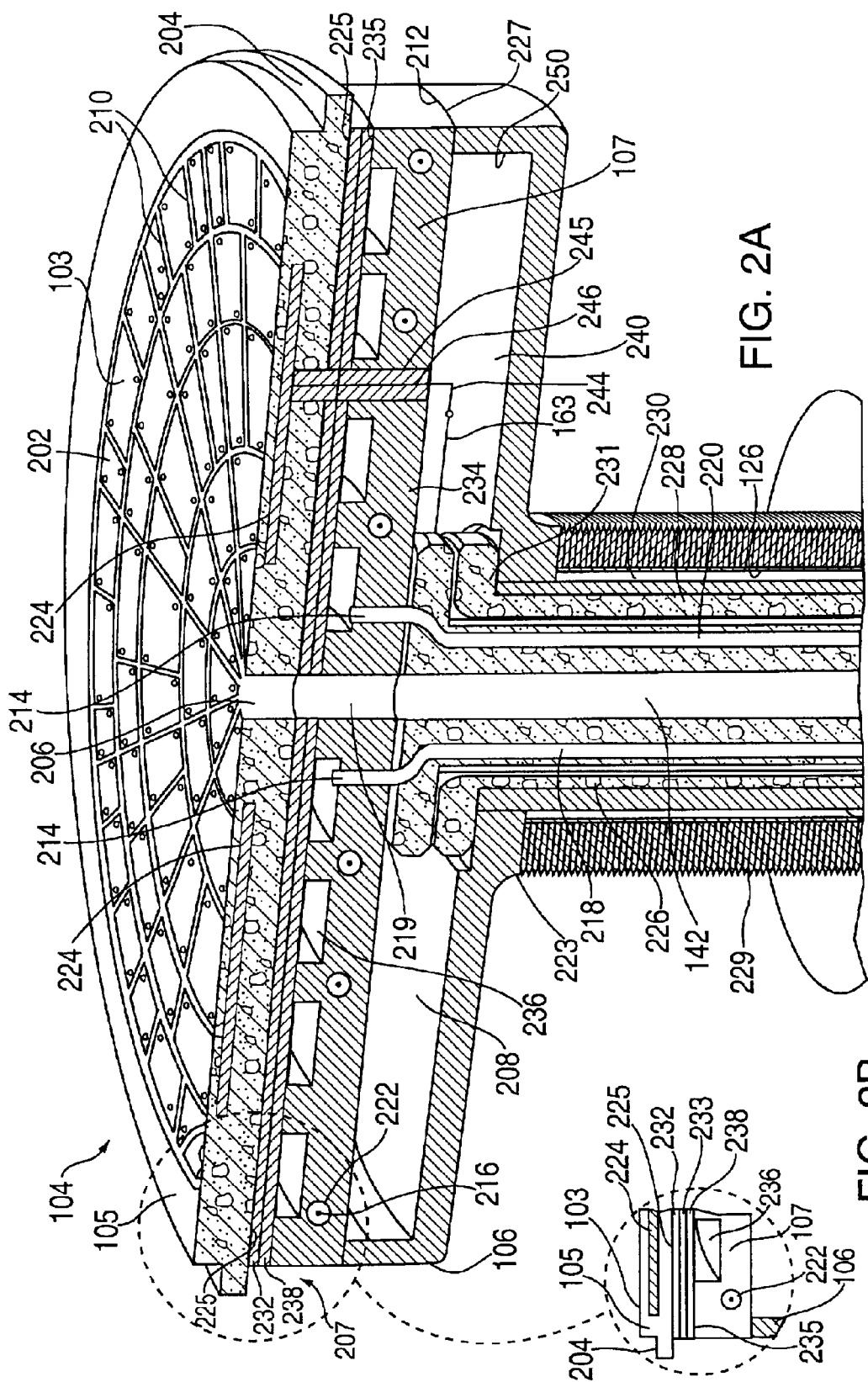
FIG. 2A depicts a partial perspective, cross-sectional view of a first embodiment of a workpiece support assembly of the workpiece processing chamber of FIG. 1.
FIG. 2B depicts an enlarged cross-sectional view of a portion of the first embodiment of the workpiece support assembly of FIG. 2A.

FIG. 2A depicts a partial perspective, cross-sectional view of a first embodiment of a workpiece support assembly 104 of FIG. 1. FIG. 2B depicts an enlarged cross-sectional view of a portion of the first embodiment of the workpiece (e.g., wafer) support assembly 104 of FIG. 2A. FIGS. 2A and 2B (collectively FIG. 2) together provide full area temperature control for the electrostatic chuck 105. Specifically, the wafer support assembly 104 comprises an electrostatic chuck assembly 109 coupled to a pedestal 106. The electrostatic chuck assembly 109 further comprises the electrostatic chuck 105 coupled to the cooling plate 107. The cooling plate 107 is then coupled to an upper surface of the pedestal 106. The electrostatic chuck 105 may be fabricated from a ceramic material such as aluminum nitride, silicon dioxide, silicon nitride, alumina, and the like. Preferably, the electrostatic chuck 105 is fabricated from aluminum nitride and shaped as a thin circular puck. An example of a ceramic electrostatic chuck that may be used in this apparatus is disclosed in commonly assigned U.S. Pat. No. 5,656,093, issued Aug. 12, 1997 to Burkhart, and is incorporated herein by reference. Specifically, that reference discloses a ceramic electrostatic chuck having a wafer spacing mask 202 of a metallic material deposited on the chuck surface 103.

The electrostatic chuck 105 also comprises a peripheral flange 204, which circumscribes a lower edge of the electrostatic chuck 105. The flange 204 is optionally used to support the waste ring 108 and/or cover ring 138. The waste ring 108, cover ring 138, and peripheral flange 204 together help prevent deposit material from accumulating below the surface 103 of the chuck 105.

Moreover, the electrostatic chuck 105 includes one or more chucking electrodes 224. The chucking electrodes 224 are fabricated from a conductive material, such as tungsten, graphite, copper, and the like. The chucking electrodes 224 are disposed relatively close to the top surface 103 of the electrostatic chuck 105. In this manner, the chucking electrodes 224 provide the necessary electrostatic force to the backside of a workpiece (not shown in FIG. 2A) to retain the workpiece on the electrostatic chuck 105. The chucking electrodes 224 may be configured in any manner necessary to retain the workpiece upon the puck. For example, the chucking electrodes 224 may be in a monopolar configuration, bipolar configuration, zoned chucking configuration, and the like. In the embodiment of FIG. 2A, the chucking electrodes have a bipolar configuration. The chucking electrodes 224 are also connected to a remote power source, i.e. the high voltage DC (HVDC) power supply 122.

Referring to FIG. 1, the HVDC power supply 122 comprises a pair of dual terminal DC voltage supplies 162 and 164 optionally having a center tap 166. The cathode on one of the pair of voltage supplies 162 is coupled via electrode lead 163 to one of the bipolar chucking electrodes 224, and the anode from the other voltage supply 164 is coupled via electrode lead 165 to the other bipolar chucking electrode 224. The cathode of voltage supply 164 is coupled to the anode of voltage supply 162 with the center tap 166 being coupled therebetween. The center tap 166 is further coupled to the support surface 103 of the electrostatic chuck 105. As such, variations in electrostatic force due to physical variations in the distance between the wafer and electrodes may be compensated. Such physical variations include dielectric thickness, wafer backside roughness, chuck surface roughness, chuck surface conductivity, and the like. As such, changes in the electrostatic force are balanced or compensated by having the center tap 166 of the power supply 122 illustratively coupled to a spacing mask 202 on the surface of the 103 of the electrostatic chuck 105.

Referring to FIG. 2A, the electrode leads 163 and 165 traverse through the shaft 126 and into an enclosure 208 formed between a bottom 212 of the cooling plate 107 and the pedestal 106. In this bipolar configuration, each chucking electrode 224 is respectively coupled to an electrode feed-through 244. Each electrode feed-through 244 is disposed in a respective feed-through bore 246, which extends through the bottom surface 225 of the chuck 105 and the cooling plate 107. Specifically, each feed-through 244 is respectively inserted into the pair of feed-through bores 246 (only one of the feed-through bores shown) and surrounded by an insulating sleeve 245 such as alumina (AlO$_3$). Each electrode lead 163 and 165 is then respectively coupled to the electrode feed-through 244 (only one of the pair shown) to provide power (e.g., DC power) to the electrodes 224.

The cooling plate 107 provides temperature regulation for the electrostatic chuck. In the preferred embodiment, the cooling plate 107 and the top surface 103 of the electrostatic chuck 105 have substantially equal diameters. In one embodiment, the cooling plate 107 has a diameter at least equal to the diameter of the support surface 103 of the electrostatic chuck 105. The cooling plate 107 allows for full area temperature control. Specifically, since the cooling plate 107 is disposed beneath and extends in diameter at least the same diameter as the support surface 103 of the electrostatic chuck 105, temperature regulation is provided over the entire area of the support surface 103.

In the first embodiment of the invention depicted in FIG. 2, the cooling plate 107 is fabricated from a material such as zirconium or its alloys, or KOVAR®. KOVAR® is the trade name for an iron/nickel/cobalt alloy originally manufactured and sold by Westinghouse Electric Co. Additionally, the cooling plate 107 may be plated (e.g., nickel plating) to prevent oxidation of the cooling plate material.

The cooling plate 107 and electrostatic chuck 105 are low temperature brazed together, using for example an aluminum alloy brazing material, to allow for full area temperature control as beneath the top surface 103 of the chuck 105. Low temperature brazing occurs in a temperature range of 110° C. to 660° C. Brazing at temperatures above 660° C. is considered high temperature brazing. Furthermore, such low temperature brazing provides a hermetic seal as between the electrostatic chuck 105 and the cooling plate 107, which helps maintain the vacuum environment in the processing area from the atmospheric environment within the chuck assembly 109.

The cooling plate 107 comprises various components that assist in regulating the temperature of the electrostatic chuck 105, as well as assisting in biasing of the workpiece (wafer) 102 during processing. In particular, the cooling plate 107 comprises a body 234, which may optionally function as an electrode. In this instance, the body 234 is coated from a material (e.g., silver or nickel/copper), which is a high conductor of RF power.

The cooling plate further comprises a cooling channel 236 positioned at the upper surface 235 of the cooling plate 107. In one embodiment of the invention, the cooling channel 236 extends radially outward in the cooling plate body 234 in a coil like manner. The cooling channel is formed (e.g., machined, etched, or the like) in the upper surface 235 of the cooling plate 107.

FIG. 2B depicts an enlarged cross-sectional view of a portion of the first embodiment of the workpiece support assembly 104 of FIG. 2A. In one exemplary embodiment, a top plate 238 is disposed on the upper surface 235 of the cooling plate 107 to form a composite cooling plate structure 207. The top plate 238 may be fabricated from a material that has a coefficient of expansion that is intermediate as between the electrostatic chuck 105 and the cooling plate 107. In this manner, the top plate 238 may optionally serve as a thermal transition layer. The top plate 238 may be brazed or welded thereon, depending on the fabrication material of the cooling plate 107 and top plate 238, to form the composite cooling plate structure 207. As such, the coefficients of thermal expansion as between the chuck 105 and cooling plate 107 change gradually, as opposed to abruptly changing at the bottom surface 225 of the electrostatic chuck 105 and the upper surface 235 cooling plate 107. Thus, the top plate 238 serves to seal the cooling channel 236, as well as provide an intermediate coefficient of thermal expansion so as to prevent fatigue and/or cracking of the electrostatic chuck 105.

In a second exemplary embodiment, the top plate 238 and cooling plate 107 may be fabricated from the same materials (e.g., KOVAR®, zirconium, and the like), while the electrostatic chuck 105 is fabricated from a dissimilar material (e.g., aluminum nitride). As such, a transition layer 233 may optionally be disposed between the top plate 238 and electrostatic chuck 105. In one embodiment, the transition layer 233 may be deposited on the bottom surface 225 of the electrostatic chuck prior to attachment to the composite cooling plate structure 207. The transition layer 233 is fabricated from a material specifically selected with a coefficient of thermal expansion value intermediate to the coefficient of expansion values of both the chuck 105 and composite cooling plate structure 207.

For example, where a aluminum nitride chuck and zirconium alloy cooling plate assembly are to be joined, a transition layer 233 such as the metal matrix material Al—Si—SiC or the like may be utilized. Moreover, concentrations of the various metal matrix composite materials selected for the transition layer 233 are dependent on the composition of the electrostatic chuck 105 and the cooling plate 107 and may be selected accordingly. As such, the top plate 238 and/or transition layer 233 provide an effective buffer between two dissimilar materials to reduce thermal stresses therebetween, which may occur due to thermal loading.

Preferably, a metalization layer 232 is deposited on the bottom surface 225 of the ceramic electrostatic chuck 105 prior to bonding the chuck 105 to the cooling plate 107. Specifically, a metal, such as titanium, having a thickness of 500 angstroms to 5000 angstroms, is deposited (via physical vapor deposition or other similar techniques) on the bottom surface 225 of the ceramic electrostatic chuck 105. The metalization layer 232 acts as an adhesive layer to bond the ceramic chuck 105 with the composite cooling plate 207 and increase bonding strength therebetween. Thereafter, a top coating such as nickel (not shown) having a thickness of approximately 200 angstroms is deposited over the titanium layer to prevent oxidation of the titanium layer. The composite cooling plate 207 and electrostatic chuck are then low temperature brazed together to form the chuck assembly 109. Such low temperature brazing technique prevents deformation of the chuck 105 or composite cooling plate 207, which would occur if high temperature brazing or welding is performed.

In a third exemplary embodiment, the cooling plate 107 is fabricated from aluminum nitride (AlN). The cooling plate 107 is illustratively manufactured from "green tapes" of aluminum nitride, which are layered and configured to form the body 234 of the cooling plate 107 with the cooling channels 236 defined therein. Once the cooling plate 107 is formed, the cooling plate 107 is densified (e.g., sintered, hot pressed and the like). As such, a top plate 238 is not required in this third embodiment. Moreover, the transition layer 233 is not required where an AlN electrostatic chuck 105 is disposed over the AlN cooling plate 107 and low temperature brazed thereon. The transition layer 233 is not required since the coefficients of thermal expansion for the cooling plate 107 and electrostatic chuck 105 are approximately the same. Moreover, the metalization layer 232 is required on both surfaces of the aluminum nitride cooling plate 107 and chuck 105. Additionally, a person skilled in the art will recognize that an aluminum nitride cooling plate may alternately be diffusion bonded to the aluminum nitride electrostatic chuck 105 prior to hot temperature brazing the cooling plate and chuck together.

The cooling plate 107 (for any of the fabrication materials described above) further comprises a pair of cooling channel bores 214. The pair of cooling channel bores 214 extend substantially vertical through the cooling plate 107, and each of the pair intersects with the cooling channel 236. The pair of cooling channel bores 214 are illustratively disposed over the shaft 126 and aligned with an inlet cooling line 218 and an outlet cooling line 220. The inlet and outlet cooling lines 218 and 220 are typically fabricated from a metal such as stainless steel. In an instance where the cooling plate 107 is fabricated from a materials other than those containing molybdenum, aluminum nitride, or the metal matrix composition Al—Si—SiC, the cooling lines 218 and 220 extend to and are coupled directly to the bottom surface 212 of the cooling plate 107. Specifically, the cooling lines 218 and 220 are disposed over, and high temperature brazed around the circumference of the cooling channel bores 214 to form a closed coolant circulation system.

As such, the inlet and outlet cooling lines 218 and 220 provide a forward and return path for a coolant (i.e., water)

to the cooling plate 107. The coolant is circulated through the cooling channels 236 to reduce the temperature of the electrostatic chuck 105. Furthermore, the pair of cooling lines 218 and 220 may be coated with a RF conductive material such as silver, nickel/copper, and the like. Cooling lines 218 and 220 fabricated from KOVAR® are preferably utilized when a coolant other than water (e.g., GALDEN®) is used.

A heater electrode 222 may also be disposed in the body 234 of the cooling plate 107 as a second temperature control element. In particular, the body 234 of the cooling plate 107 comprises one or more heater electrode channels 216 for retaining one or more heater electrodes 222. In a preferred embodiment, a single heater electrode channel 216 having a single heater electrode 222 extends radially outward in the cooling plate body 234 in a coil like manner. However, a person skilled in the art for which the invention pertains will recognize that the heater electrode 222 may be in a zoned heating configuration, may be a plurality of heater electrodes radiating concentrically, or in any other pattern that will uniformly transfer heat to the electrostatic chuck 105. In one embodiment, the heater electrode 222 is a coil heater and is connected to the remote power source 122 (see FIG. 1). In this manner, the heater electrode 222 generates heat, which is thermally conducted through the cooling plate body 234 and the electrostatic chuck 105 to maintain the workpiece at proper processing temperatures, as well as bake out any undesired moisture accumulating on the wafer support assembly 104 during processing.

Referring to FIG. 2A, a third temperature control element utilized is the backside gas delivery system 130. In particular, the backside gas delivery system 130 comprises in part, a gas conduit 142, a cooling plate gas aperture 219, a chuck gas aperture 206, and a plurality of grooves 210 formed in the surface 103 of the electrostatic chuck 105. The gas conduit 142 extends vertically from the bottom of the shaft 126 to the cooling plate gas aperture 219 formed in the cooling plate 107.

The gas conduit 142 may be high temperature brazed or low temperature electron-beam welded directly over the cooling plate gas aperture 219. For example, a metal gas conduit (e.g., stainless steel) may be electron-beam welded directly to a cooling plate fabricated from zirconium, a zirconium alloy, or KOVAR®.

Furthermore, the cooling plate gas aperture 219 is axially aligned with the chuck gas aperture 210, and the plurality of grooves 210 extend radially from the chuck gas aperture 210. As such, the backside gas (e.g., helium) is provided from the remote gas sources 133 or 134, through the gas conduit 142, the cooling plate gas aperture 219, the chuck gas aperture 206, and across the surface 103 of the chuck 105 via the plurality of grooves 210.

Once the composite cooling plate 207 and electrostatic chuck 105 are low temperature brazed together, the combined chuck/cooling plate (i.e., chuck assembly 109) is then attached to the pedestal 106. The pedestal 106 is preferably fabricated from a metallic material, such as stainless steel, aluminum, nickel, a nickel alloy, or the like. Where the cooling plate 107 is fabricated from a material such as KOVAR®, zirconium, or a zirconium alloy, the cooling plate 107 is electron-beam welded directly to the pedestal 106. Electron beam welding is utilized to provide a low temperature welding technique around the perimeter between both bottom surface 212 and upper surface 227 of the cooling plate 107 and pedestal 106 respectively. Accordingly, for a non-detachable chuck assembly 109, electron-beam welding rigidly couples and vacuum seals the electrostatic chuck assembly 109 via the bottom 212 of the cooling plate 107 to the pedestal 106, without risking deformation or other harmful effects (e.g., contamination) caused by high temperature fabrication methods.

Figure 4:
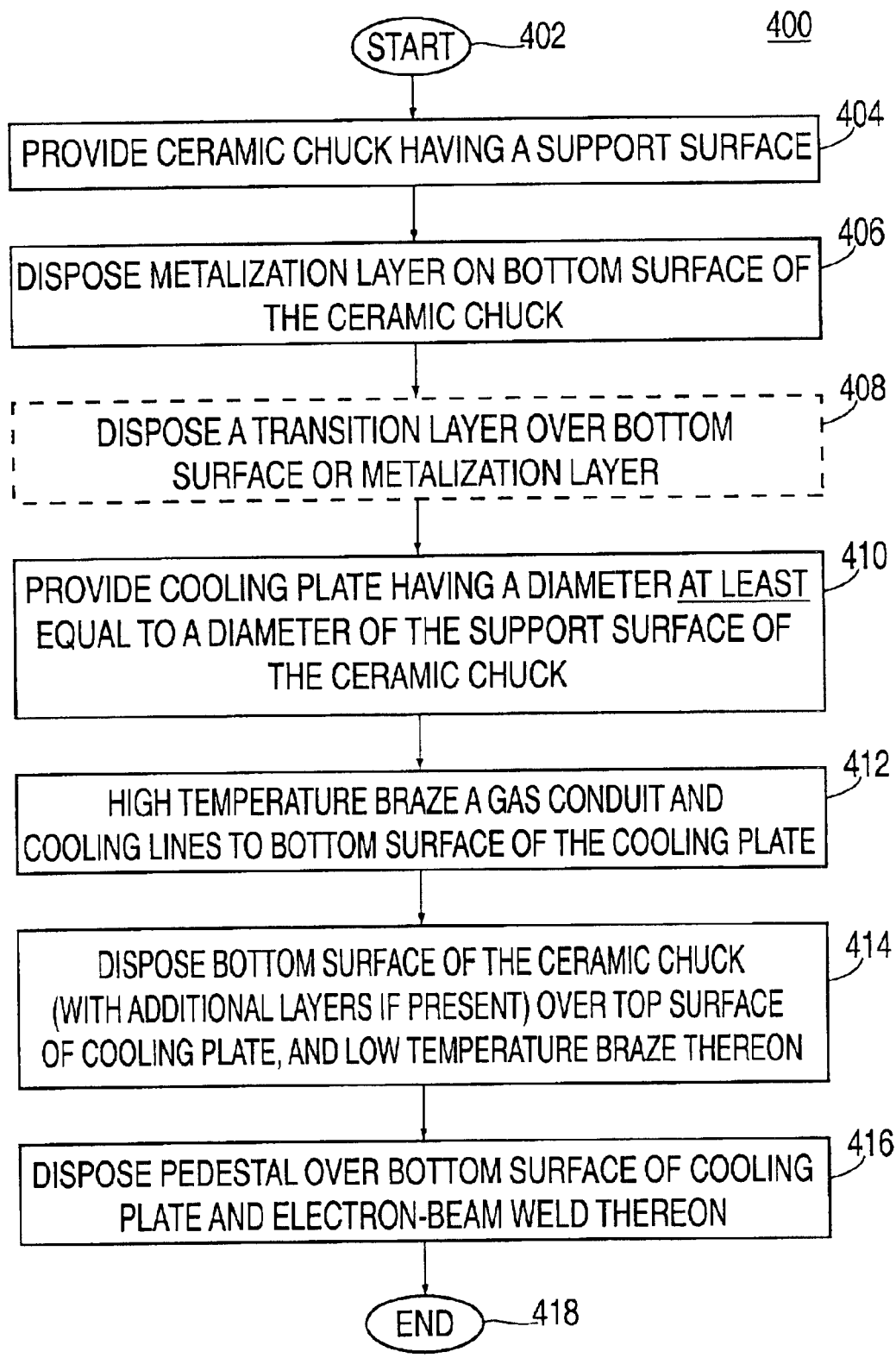
FIG. 4 depicts a flowchart of a first method of fabricating a wafer support assembly of the present invention.

FIG. 4 depicts a flow chart for a first method 400 of fabricating the wafer support assembly 104. FIG. 4 should be viewed in combination with FIGS. 2A and 2B. The method 400 begins at step 402 and proceeds to step 404, where a ceramic electrostatic chuck 105, such as an aluminum nitride chuck having a support surface diameter of 200 or 300 millimeters, is provided. In step 406, a metalization layer 232 (e.g., titanium) is deposited on the bottom surface 225 of the electrostatic chuck 105.

Furthermore, in step 408 (drawn in phantom in FIG. 4), an optional transition layer 233 (shown in FIG. 2B) may be deposited on the bottom surface 225 of the electrostatic chuck 105. In particular, the transition layer 233, which is approximately a same diameter as the support surface 103 of the ceramic chuck, is deposited (e.g., by PVD or CVD processes) on the bottom surface 225 of the electrostatic chuck 105. The transition layer 233 preferably has a thickness of 0.125 inches and is illustratively fabricated from a metal matrix composite Al—Si—SiC having a ratio of aluminum to silicon of 30% to 70%. Alternately, the transition layer 233 may be a sheet, foil-like material disposed on the bottom surface 225 of the electrostatic chuck 105. Furthermore, the transition layer 233 is either deposited or disposed over the metalization layer 232. The method 400 then proceeds to step 410.

In step 410, the cooling plate 107 is provided. In particular, the cooling plate 107 has a diameter at least equal to the diameter (e.g., 300 mm) of the support surface 103 of the ceramic chuck 105. In step 412, a gas conduit 142 and pair of cooling lines 218 and 220 are high temperature brazed to the bottom surface 212 of the cooling plate 107. In particular, the gas conduit is disposed over the circumference of the cooling plate gas aperture 219, and the pair of cooling lines 218 and 220 are respectively disposed over the circumference of the pair of cooling channel bores 214. The cooling plate 107, gas conduit 142, and cooling lines 218 and 220 are then high temperature brazed in a furnace. In general, brazing materials such as silver, copper, gold, nickel, alloys thereof and the like, may be utilized for high temperature brazing, which occurs in a temperature range of 660° C. to 1200° C., depending on the particular brazing material. The method 400 then proceeds to step 414.

In step 414, the combined electrostatic chuck 105, (i.e., metalization layer 232 and optional transition layer 233) is disposed over the cooling plate 107 (e.g., composite cooling plate 207). Thereafter, the electrostatic chuck 105 (including any layers 232 and 233) and the cooling plate 107 are low temperature brazed together to form the electrostatic chuck assembly 109. Low temperature brazing is optimally performed in the temperature range of 110° C. to 660° C. The metalization layer improves the bonding strength between the electrostatic chuck 105 and the cooling plate 107. Furthermore, the transition layer 233 provides a material having a thermal expansion coefficient that is intermediate to the thermal expansion coefficients as between the electrostatic chuck 105 and the cooling plate 107. Thus, the transition layer 233 assists in controlling the thermal expansions between the electrostatic chuck 105 and cooling plate 107 during assembly. In particular, when low temperature brazing the three components together, variations of thermal expansion coefficients as between the chuck 105 and cooling plate 107 are gradual (i.e., "transitional") because of the presence of the transition layer 233. Thus, the transition layer 233 thereby reduces possible deformation of the ceramic chuck or cooling plate 107 while brazing during the fabrication process. The method 400 then proceeds to step 416.

The method 400 then proceeds to step 416, where the electrostatic chuck assembly 109 is disposed and secured over the pedestal 106. For a non-detachable wafer support assembly 104, the cooling plate bottom surface 212 of the electrostatic chuck 109 is electron-beam welded to the pedestal 106. In one exemplary embodiment, the bellows 229 is welded to a bottom surface 223 of the pedestal 106 prior to electron-beam welding the cooling plate 107 and pedestal 106. In a second embodiment (not shown), the combined electrostatic chuck assembly 109 may be secured to the pedestal 106 via a detachable securing technique (e.g., bolted or clamped) about a peripheral edge of the electrostatic chuck assembly 109 and the pedestal 106. In this manner, a detachable electrostatic chuck assembly 109 is provided. In step 418, the method 400 ends. Furthermore, a person skilled in the art will recognize that the order of the steps in method 400 should not be considered as limiting. For example, steps 410 and 412 may be performed prior to steps 404 to 408. However, the high temperature brazing such as in step 412 must occur prior to the low temperature brazing step of 414. Likewise, the electron-beam welding step in step 416 occurs after the low temperature brazing of the cooling plate 107 and electrostatic chuck 105.

FIG. 3A depicts a partial perspective, cross-sectional view of a second embodiment of the workpiece support assembly 104 of the wafer processing chamber 100 of FIG. 1. FIG. 3B depicts an enlarged cross-sectional view of a portion of the second embodiment of the workpiece support assembly of FIG. 3A. FIGS. 3A and 3B (collectively FIG. 3) together depict the cooling plate 107 fabricated from molybdenum or a molybdenum alloy, such as a molybdenum/KOVAR® composite. Except for the disclosure provided below, the remainder of the workpiece support assembly 104 is the same as disclosed in the first embodiment of FIG. 2.

Recall that a molybdenum-containing material (or aluminum nitride material) and a metal, such as stainless steel, can not be easily or optimally welded together. To overcome this manufacturing difficulty, an adapter, which is fabricated from a material that may be low or high temperature brazed, as well as electron-beam welded, is utilized. In one embodiment, a pedestal joining-ring 306, which is illustratively fabricated from KOVAR®, is disposed between the molybdenum (or aluminum nitride) and metal surfaces. However, a person skilled in the art will recognize that other materials may be used to fabricate the pedestal joining-ring such as nickel, molybdenum/KOVAR®, copper, and the like may also be utilized. Furthermore, high temperature brazing may be performed using materials such as copper, nickel, silver, nickel/copper/silver, and the like.

Furthermore, a pair of cooling line rings 316 (e.g., KOVAR®) is disposed between each cooling line 218 and 220 and the cooling channel bores 214. In particular, a first end of each stainless steel cooling ring 316 is high temperature brazed around the circumference of the cooling channel bores 214 of the molybdenum cooling plate 107 prior to the electrostatic chuck assembly 109 being attached to the pedestal 106. Thereafter, the opposing end of the cooling line ring 316 is welded (e.g., electron-beam welded, arc welded, and the like) to the cooling lines 218 and 220 respectively. In this manner the pair of cooling line rings 316 serve as adapters for coupling a metal cooling lines to the molybdenum cooling plate 107.

In addition, a gas conduit ring 314, illustratively fabricated from KOVAR®, is coupled between the gas conduit 142 and the cooling plate gas aperture 219. In particular, one end of the gas conduit ring 314 is high temperature brazed around the circumference of the cooling plate gas aperture 219 prior to the electrostatic chuck assembly 109 being attached to the pedestal 106. The opposing end of the gas conduit ring 314 is subsequently welded (e.g., electron-beam welded) to the gas conduit 142. In this manner the gas conduit ring 314 serves as an adapter for coupling a metal gas conduit to the molybdenum cooling plate 107.

Furthermore, the cooling plate gas aperture 219 is axially aligned with the chuck gas aperture 210, and the plurality of grooves 210 extend radially from the chuck gas aperture 210. As such, the backside gas is provided from the remote gas sources 133 or 134, through the gas conduit 142, the gas conduit ring 314, the cooling plate gas aperture 219, the chuck gas aperture 206, and across the surface 103 of the chuck 105 via the plurality of grooves 210.

Moreover, in this second embodiment (FIG. 3), where the cooling plate 107 is fabricated from molybdenum, a molybdenum alloy, or aluminum nitride, electron-beam welding is not an optimum method to attach the bottom 212 of the molybdenum cooling plate 107 to the metal pedestal 106. As such, a pedestal joining-ring 306 (e.g., a KOVAR pedestal joining-ring) is provided between the cooling plate 107 and the pedestal 106. In particular, an upper surface 313 of the pedestal joining-ring 306 is high temperature brazed around the circumference of the bottom surface 212 of the cooling plate 107. The pedestal joining-ring 306, which is now attached to the chuck assembly 109, is then electron-beam welded to the pedestal 106. Specifically, the lower surface 311 of the pedestal joining-ring 306 is electron-beam welded to the upper surface 227 of the pedestal 106. In this manner, the electrostatic chuck assembly 109 is prefabricated with the pedestal joining-ring 306, gas conduit ring 314 and cooling line rings 316, which serve as adapters for subsequent and expedient assembly on the pedestal 106.

Moreover, FIG. 3 illustratively shows the pedestal joining-ring positioned at the outer edge of the bottom surface 212 of the cooling plate 107. However, the pedestal joining-ring 306 and pedestal 106 may alternately have a diameter less than the diameter (i.e., outer edge) of the bottom surface 212 of the cooling plate 107. Accordingly, the lift pins 110 circumscribe the pedestal 306 and are disposed only through the cooling plate 107 and electrostatic chuck 105.

Figure 5:
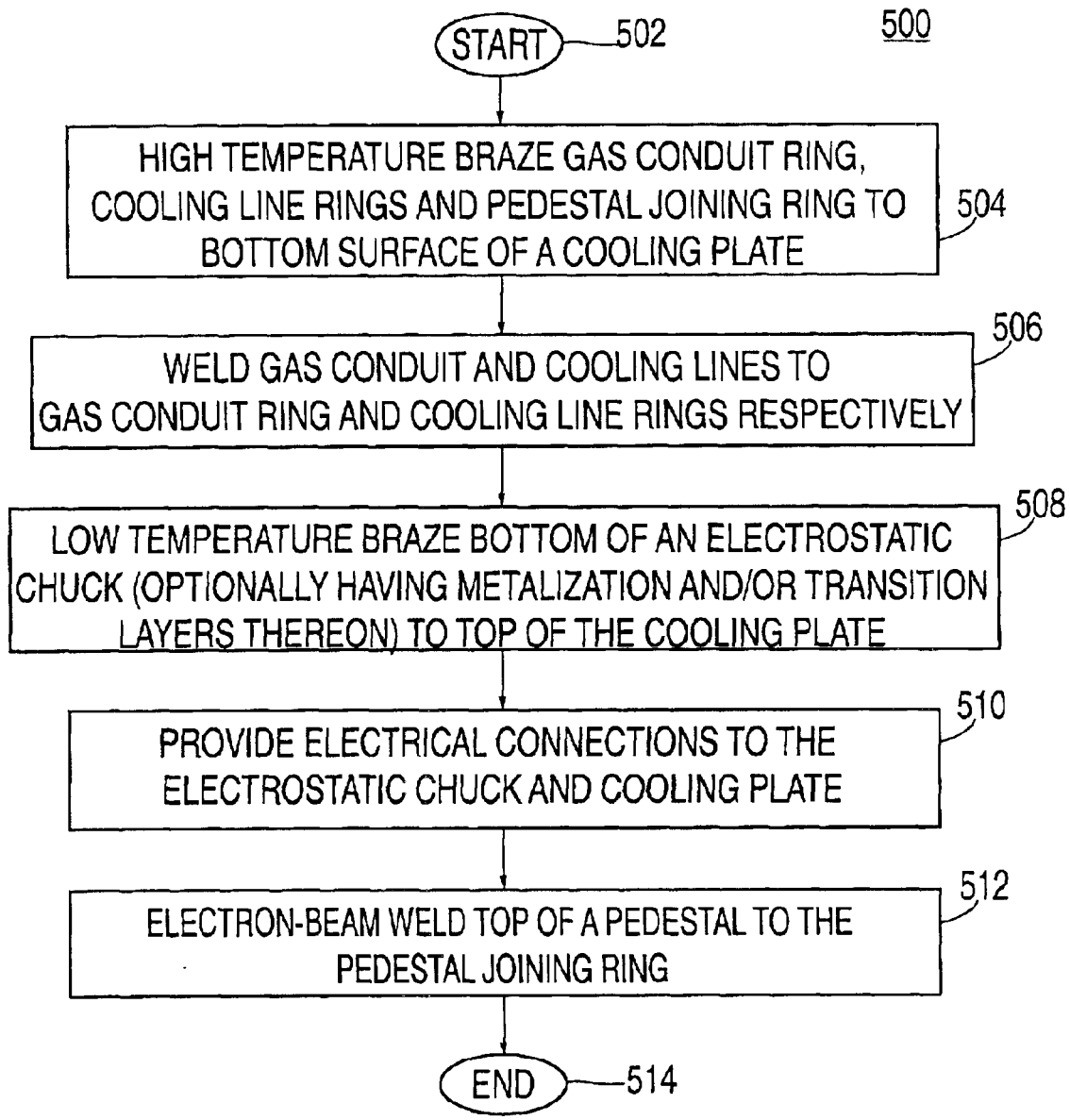
FIG. 5 depicts a flowchart of a second method of fabricating a wafer support assembly of the present invention.

FIG. 5 depicts a flowchart of a second method 500 of fabricating the wafer support assembly 104. The method 500 is utilized where the cooling plate 107 is fabricated from molybdenum-containing material or aluminum nitride, and the pedestal 106 is a metal such as stainless steel. FIG. 5 should be viewed in conjunction with FIGS. 3A and 3B. The method 500 begins in step 502 and proceeds to step 504 where a gas conduit ring 314, a pair of cooling line rings 316, and a pedestal joining-ring 306 are high temperature brazed to the bottom surface 212 of the composite cooling plate 207. In particular, the gas conduit ring 314 is disposed over the circumference of the cooling plate gas aperture 219. Additionally, the pair of cooling line rings 316 is respectively disposed over the circumferences of the pair of cooling channel bores 214. Furthermore, the upper surface 313 of the pedestal joining-ring 306 is disposed around the periphery of the bottom surface 212 of the cooling plate 107. The composite cooling plate 207, and the rings 314, 316, and 306 are then high temperature brazed in a furnace, and the method 500 proceeds to step 506.

In step 506, the gas conduit 142 and pair of cooling lines 218 and 220 are respectively attached to the gas conduit ring 314 and pair of cooling line rings 316. In particular, the gas conduit 142 and pair of cooling lines 218 and 220 are respectively welded (e.g., electron-beam welded, arc welded, and the like) to the gas conduit ring 314 and pair of cooling line rings 316. The method 500 then proceeds to step 508.

In step 508, the bottom surface 225 of the ceramic electrostatic chuck 105 is low temperature brazed to the upper surface of the top plate 238 of the cooling plate 107. For a cooling plate 107 fabricated from a molybdenum-containing material, a metalization layer 232, and optionally, a transition layer 233, are provided on the bottom surface 212 of the electrostatic chuck prior to low temperature brazing to the cooling plate 107. However, where both the electrostatic chuck 105 and the cooling plate 107 are fabricated from aluminum nitride, then the transition layer 233 is not required, since the thermal expansion coefficients are substantially the same. Moreover, the metalization layer 232 is required on both surfaces of the aluminum nitride cooling plate 107 and chuck 105. In addition, a person skilled in the art will recognize that an aluminum nitride cooling plate may alternately be diffusion bonded to the aluminum nitride electrostatic chuck 105 prior to hot temperature brazing the cooling plate and chuck together.

In step 510, the electrical connections to the electrostatic chuck 105 are provided. In particular, the electrode leads 163 and 165 are coupled to the electrode feed-throughs 244, as well as the wiring to the heater electrode or electrodes 222. Thereafter, in step 512, the lower surface 311 of the pedestal joining-ring 306 is disposed over and electron-beam welded to the upper surface 227 of the pedestal 106. The method 500 then ends in step 514.

Therefore, in one exemplary embodiment, FIGS. 3A and 3B illustratively depict an electrostatic chuck 105 that is low temperature braised to a cooling plate 107, prior to the cooling plate 107 being attached to a pedestal 106. Furthermore, when the cooling plate 107 is fabricated from molybdenum or an alloy thereof, or aluminum nitride, the rings 306, 314, and 316 are first high temperature brazed to the bottom surface 212 of the cooling plate 107 prior to low temperature brazing the cooling plate 107 to the ceramic chuck 105. As such, the rings 306, 314, and 316 readily allow for electron-beam welding the chuck assembly 109 to a metal (e.g., stainless steel) pedestal 106, as well as attaching (i.e., welding) the gas conduit 142 and cooling lines 218 and 220 to the bottom 212 of the cooling plate 107.

In a derivation of the second exemplary embodiment, which is also represented by FIGS. 3A and 3B, the cooling plate 107 is fabricated from a metal matrix composite material Al—Si—SiC. Since aluminum has a low melting point, high temperature brazing is not utilized. Rather, the pedestal joining-ring 306, gas conduit ring 314, and cooling line rings 316 are low temperature brazed to the bottom surface 212 of the cooling plate 107. As such, fabrication for a chuck assembly 109 having an Al—Si—SiC cooling plate 107 differs from the high temperature brazing in step 504 of the first exemplary embodiment (molybdenum or aluminum nitride materials) in FIG. 3.

Figure 6:
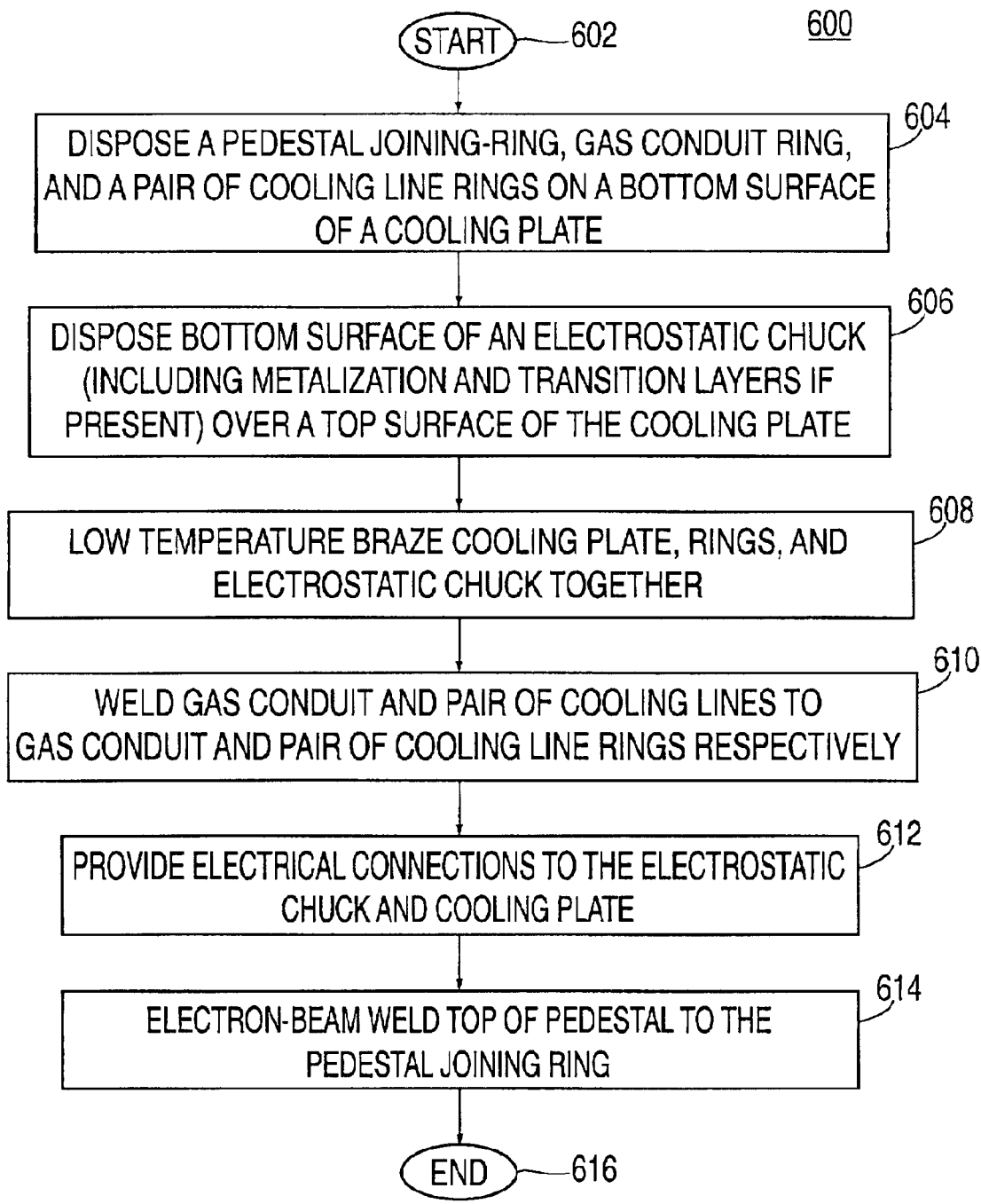
FIG. 6 depicts a flowchart of a third method of fabricating a wafer support assembly of the present invention.

FIG. 6 depicts a flowchart of a third method 600 of fabricating a wafer support assembly 104 of the present invention. The method 600 is utilized where the cooling plate 107 is fabricated from the metal matrix composite Al—Si—SiC, and the pedestal 106 is a metal such as stainless steel. FIG. 6 should be viewed in conjunction with FIG. 3. The method 600 starts in step 602 and proceeds to step 604, where a pedestal joining-ring 306, gas conduit ring 314, and pair of cooling line rings 316 are disposed on the bottom surface 212 of the cooling plate 107 (e.g., composite cooling plate 207). In step 606, the bottom surface 225 of the electrostatic chuck 105 is disposed over the top of the cooling plate 107. Moreover, the metalization layer 232 (and optional transition layer 233) is disposed (e.g., deposited via a deposition process) on the bottom surface 225 of the electrostatic chuck 105 prior to placement over the cooling plate 107. The method 600 then proceeds to step 608.

In step 608, the electrostatic chuck 105, cooling plate 107 and rings 306, 314, and 316 are low temperature brazed together to form the electrostatic chuck assembly 109. As such, only a single low temperature brazing operation need be performed to unite and secure the various components together as the electrostatic chuck assembly 109. The method 600 then proceeds to step 610.

In step 610, the gas conduit 142 is welded to the gas conduit ring 314, and the inlet and outlet cooling lines 218 and 220 are welded to the cooling line rings 316. Welding techniques illustratively include electron-beam welding, arc welding, and the like. The method 600 then proceeds to step 612. In step 612, the electrical connections are illustratively provided to the electrode feed-throughs 244 and heater electrode 222. In step 614, the upper surface 227 of the pedestal 106 is electron-beam welded to the lower surface 311 of the pedestal joining-ring 306, and in step 616, method 600 ends.

FIG. 7A depicts a partial perspective, cross-sectional view of a third embodiment of the workpiece support assembly of the workpiece processing chamber of FIG. 1. FIG. 7B depicts an enlarged cross-sectional view of a portion of the third embodiment of the workpiece support assembly of FIG. 7A. In this third embodiment, the diameter of the cooling plate 107 is illustratively shown as having a diameter less than the diameter of the support surface 103 of the electrostatic chuck 105. However, such illustrative embodiment should not be considered as limiting. In fact, the cooling plate 107 may alternately have a diameter at least equal to the diameter of the support surface 103 of the electrostatic chuck 105 such as depicted in FIGS. 2 and 3.

The cooling plate 107 is low temperature brazed to the electrostatic chuck 105 in a similar manner as disclosed with regard to the first and second embodiments of FIGS. 2 and 3. Furthermore, the pedestal joining-ring 306 circumscribes the cooling plate 107, whereby the pedestal 106 is attached to the ceramic chuck 105, as opposed to being attached to the cooling plate 107, as in the embodiments of FIGS. 2 and 3. Specifically, the upper surface 313 of the pedestal joining-ring 106 is high temperature brazed to the electrostatic chuck 105, and a lower surface 311 of the pedestal joining-ring 306 is then electron-beam welded to the pedestal 106. The cooling plate 107 may be fabricated from any of the aforementioned materials such as molybdenum or a molybdenum alloy, a molybdenum/KOVAR® composite, KOVAR®, zirconium or a zirconium alloy, a metal matrix composite Al—Si—SiC, aluminum nitride, and the like. Therefore, since the pedestal 106 does not interface with the cooling plate 107, the gas conduit ring 314 and cooling line rings 316 are utilized based upon the fabrication material the cooling plate 107. Except as disclosed below, the rest of the wafer support assembly components are the essentially the same as disclosed in the second embodiment of FIG. 3.

Figure 7:
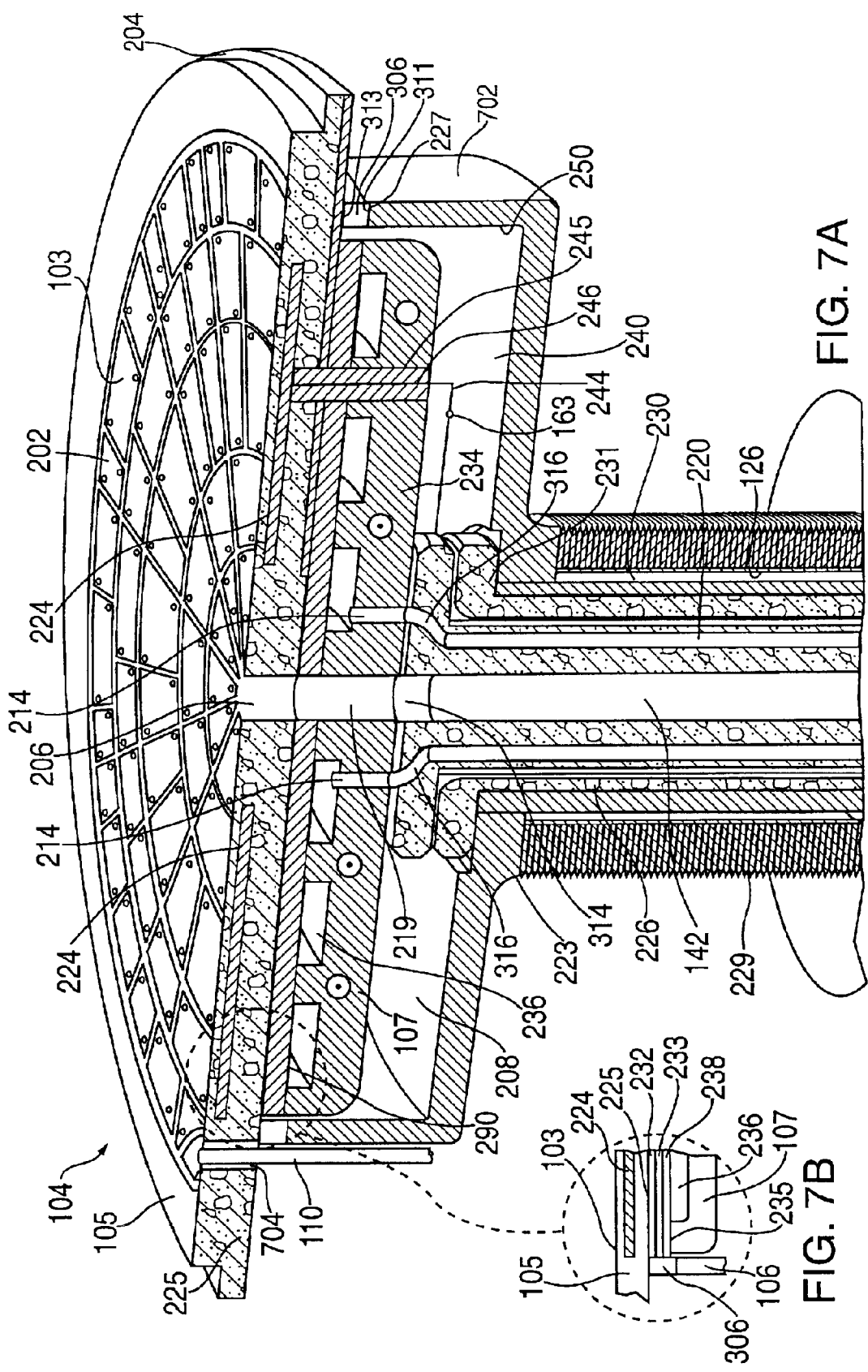
FIG. 7A depicts a partial perspective, cross-sectional view of a third embodiment of the workpiece support assembly of the workpiece processing chamber of FIG. 1.
FIG. 7B depicts an enlarged cross-sectional view of a portion of the third embodiment of the workpiece support assembly of FIG. 7A.
Figure 8:
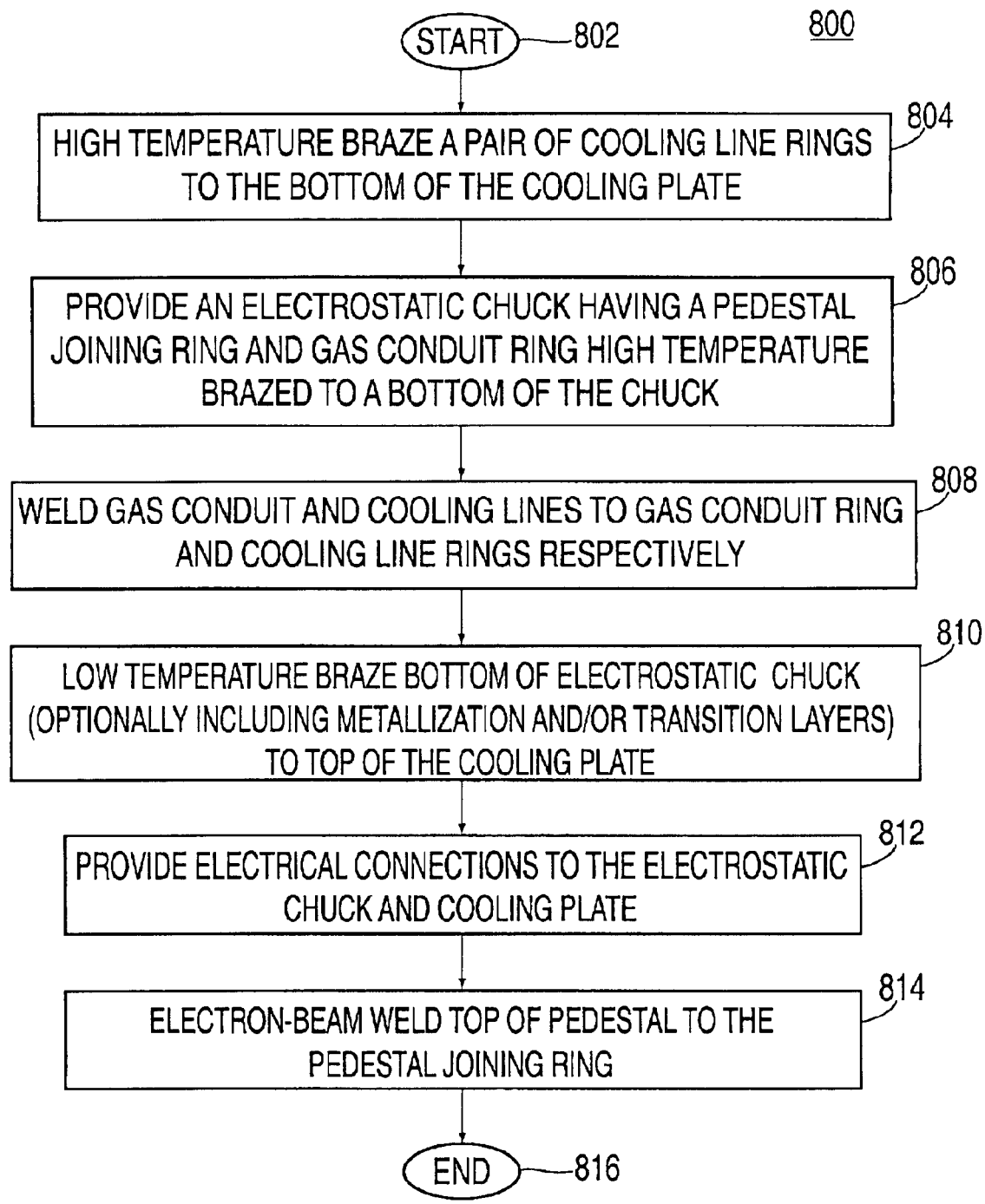
FIG. 8 depicts a flowchart of a fourth method of fabricating a wafer support assembly of the present invention.

FIG. 8 depicts a flowchart of a fourth method 800 of fabricating a wafer support assembly 104 of the present invention. The method 800 is illustratively described for a cooling plate 107 fabricated from a molybdenum-containing material, and the pedestal 106 is a metal such as stainless steel. FIG. 8 should be viewed in conjunction with FIGS. 7A and 7B (collectively FIG. 7). The method 800 begins in step 802 and proceeds to step 804, where a pair of cooling rings 316 are attached to a bottom surface 212 of the cooling plate 107. For a cooling plate 107 fabricated from a molybdenum-containing material or aluminum nitride, the pair of cooling rings 316 are high temperature brazed over the pair of cooling channel bores 214 of the cooling channel 236. Alternately, where the cooling plate 107 is fabricated from Al—Si—SiC, the pair of cooling rings 316 are low temperature brazed over the pair of cooling channel bores 214 of the cooling channel 236. Furthermore, where the cooling plate is fabricated from a zirconium-containing material, KOVAR®, and the like, then the pair of cooling rings 316 are not required. Once the cooling plate 107 is provided with or without the cooling line rings 316 as required, the method 800 then proceeds to step 806.

In step 806, an electrostatic chuck 105 is provided having a pedestal joining-ring 306 and a gas conduit ring 314 high temperature brazed to a bottom surface 225 of the chuck 105. In particular, the gas conduit ring 314 is disposed over the chuck gas aperture 206. Furthermore, the pedestal joining-ring 306, which has a diameter greater than the diameter of the cooling plate 107, is disposed on the bottom surface 225 of the electrostatic chuck 105.

In step 808, the gas conduit 142 is welded to the gas conduit ring 314 on the electrostatic chuck 105, and the cooling lines 218 and 220 are welded to the cooling line rings 316 on the cooling plate 107. The gas conduit 142 and pair of cooling lines 218 and 220 may be electron-beam welded, arc welded, and the like. The method 800 then proceeds to step 810.

In step 810, the bottom surface 225 of the electrostatic chuck 105, metalization layer 232, and optional transition layer 233 (FIG. 7B), is low temperature brazed to the cooling plate 107 (e.g., the top plate 238). Low temperature brazing includes using materials such as aluminum, gold/tin, gold/germanium, gold/copper, silver/tin, gold/indium, aluminum/silicon/magnesium, and silver/copper, or any other material suitable for low temperature brazing.

Referring to FIG. 7A, the gas conduit ring 314 is high temperature brazed to the bottom surface 225 of the electrostatic chuck 105 (step 806). As such, the gas conduit ring 314 passes through the cooling plate gas aperture 219 and extends a distance beyond the bottom surface 212 of the cooling plate 107. Alternately, the gas conduit ring 314 may be brazed over the cooling plate gas aperture 219, directly to the bottom surface 212 of the cooling plate 107, as shown in FIG. 3A, prior to the low temperature brazing step 810. For example, where the cooling plate 107 is fabricated from molybdenum or aluminum nitride, the gas conduit ring 314 is high temperature brazed thereon. Alternately, where the cooling plate 107 is fabricated from Al—Si—SiC (as in FIG. 3), the gas conduit ring 314 and pair of cooling line rings 316 are low temperature brazed thereon. Moreover, where the cooling plate 107 is fabricated from zirconium, a zirconium alloy, KOVAR®, and the like (as in FIG. 2), neither the gas conduit ring 314 or cooling line rings 316 are required. The rings 314 and 316 are not required since the gas conduit 142 and cooling lines 218 and 220 can be high temperature brazed directly to the bottom of the cooling plate 107. Once the electrostatic chuck 105 and cooling plate 107 are low temperature brazed together, the combined structure (i.e., electrostatic chuck 105 and composite cooling plate 207) forms the chuck assembly 109 that may be easily installed on the pedestal 106.

In step 812, the electrical connections are provided to the electrostatic chuck assembly 109. In particular, the electrical wiring to the electrode feed-throughs 244 and heater electrode 222 are installed. The method 600 then proceeds to step 814.

In step 814, the lower surface 311 of the pedestal joining-ring 306 is electron-beam welded to the upper surface 227 of the pedestal 106. Specifically, the pedestal 106 comprises an extended pedestal wall 702 having a diameter greater than the diameter of the cooling plate 107 and less than the diameter of the peripheral flange 204 of the electrostatic chuck 105. The electrostatic chuck 105 is disposed over the pedestal 106 such that the extended pedestal wall 702 supports the bottom surface 225 of the electrostatic chuck 105 via the pedestal joining-ring 306 positioned therebetween. In particular, the lower surface 311 of the pedestal joining-ring 306 is seated on the upper surface 227 of the pedestal 106 (i.e., the extended pedestal wall 702). Furthermore, the pedestal joining-ring 306 and extended pedestal wall 702 each circumscribe the outer diameter of the cooling plate 107.

Where the diameter of the cooling plate 107 is less than the diameter of the support surface 103 of the electrostatic chuck 105 (as illustratively shown in FIG. 7), the plurality of lift pins 110 (only one lift pin shown) circumscribe the cooling plate 107 and pedestal 106. In particular, the plurality of lift pins 110 respectively extend through a plurality of lift pin bores 704 (only one lift pin aperture shown in FIG. 7A), which are disposed in the electrostatic chuck 105. This arrangement helps facilitate construction of the electrostatic chuck assembly 109 and subsequently the wafer support assembly 104, since the pedestal 106 (and enclosure 208 therein) does not have to house the lift pins 110 and lift pin bores 704.

In FIG. 7A, the pedestal joining-ring 306 is illustratively shown as having a diameter less than the support surface 103 of the electrostatic chuck 105. However, in another embodiment, full area temperature control can also be achieved. In particular, the diameter of the cooling plate 107 is at least equal to the diameter of the support surface 103 of the electrostatic chuck 105 (as illustratively shown in FIGS. 2 and 3). As such, the plurality of lift pins 110 (only one lift pin shown) extend through the pedestal 106, cooling plate, and chuck 105 as discussed above. In order to maintain the environmental difference between the chamber 100 and the enclosure 208 in the pedestal assembly 104, a sealing device is provided. For example, for each lift pin 110, a respective tube (not shown) illustratively extends from the bottom 223 of the pedestal 106 to the bottom surface 212 of the cooling plate 107. In one embodiment, one end of each tube is brazed at the bottom 223 of the pedestal 106 over a respective bore (not shown). In Addition, the other end of each tube, which interfaces over the bore 704 on the bottom surface 212 of the cooling plate 107, is brazed thereon. As such, the enclosure 208 in the pedestal assembly 104 is environmentally separated from the chamber 100 via the tube, while also enabling each lift pin 110 to respectively pass through each tube and bore 704. Furthermore, the lift pins 110 are discussed herein for completeness, and one skilled in the art will recognize that other sealing techniques may be used to maintain the separate atmospheric environment in the pedestal assembly 104 from the vacuum environment in the chamber 100. In this latter derivation of the third embodiment, full area temperature control is provided over the support surface 103 of the electrostatic chuck 105, and in step 816, the method 800 ends.

In any of the embodiments depicted in FIGS. 2, 3, and 7, once the cooling plate 107 is attached to the pedestal 106, an enclosure 208 is defined therebetween. The enclosure 208 houses various components to aid in the processing of a semiconductor wafer (e.g., thermocouples, lift pins (in FIGS. 2 and 3), and other various wafer processing components). Specifically, the enclosure 208 is defined by a lower inner wall 230 of the shaft 126, floor 240 of the pedestal 106, upper inner wall 250 of the pedestal 106 and the bottom surface 212 of the cooling plate 107. The enclosure 208 is operated typically at 1 atmosphere of pressure, as compared to the processing area in the chamber 100, which operates in a near vacuum environment.

To further enhance the electrical isolation of the wafer support assembly 104, the pedestal 106 and the shaft 126 are grounded to prevent plasma ignition in the lower chamber region 140. The pedestal 106 and shaft 126 are further provided with the bellows 229, bellows thermocouple mount 228, and a bellows isolator 226. The bellows isolator 226 is preferably fabricated from an insulating material, such as ceramic and is in the form of a sleeve that insulates the lower inner wall 230 of the shaft 126 from all other components inside the enclosure 208. The bellows isolator 226 vertically extends from the bottom of the shaft 126 to the enclosure 208 and forms a lip 231 over floor 240 to support the bellows thermocouple mount 228. The bellows thermocouple mount 228 provides additional electrical isolation of the thermocouples (not shown) and the gas conduit 142 within the enclosure 208. Furthermore, the bellows 229 circumscribes the bellows isolator 226, and is electron beam welded to a bottom surface 223 of the pedestal 106. The bellows 229 extend vertically to the bottom of the shaft 126 to isolate the shaft 126 from the processing environment. Moreover, the shaft 126 is coupled to a motor (not shown), which enables the shaft 125 to be extended up or down within the chamber 100.

In operation, a wafer 102 is placed on the support surface 103 of the electrostatic chuck 105. Air is drawn out of the chamber 100 via a vacuum pump 128 to create a low-pressure environment (i.e. 1 mT −5 Torr). A process gas, preferably Argon, is introduced into the chamber 100 from one of the remote gas sources 133 or 134, which is connected to a second end of the gas conduit 142 via a flow regulator 144 and one or more valves 132 and 136 of FIG. 1. The power supply 122 is energized which electrostatically clamps the wafer 102 to the support surface 103. Specifically, the power supply 122 applies a DC bias to the chucking electrodes 224. The high voltage level produced by the power supply 122 also ignites the gas into a plasma state and biases the target 116 thereby causing the target material to sputter onto the wafer 102.

The apparatus described above provides for enhanced plasma processing by RF biasing the wafer 102 placed on top of the electrostatic chuck 105 via conductive and capacitive coupling of the RF power through various pedestal components. In one embodiment, RF power from the RF power source 124 is conducted over the surface area of the cooling plate 107, which is coated with a RF conductive material such as copper, silver, nickel, and the like.

Moreover, the electrostatic chuck 105 is fabricated from a dielectric, or high resistance material, where the RF power does not readily conduct through the body of the electrostatic chuck 105. However, the electrodes embedded within the puck body, i.e., chucking electrode 224, allow the RF power to capacitively couple through the electrostatic chuck 105. In an alternate embodiment, RF power is applied directly to the chucking electrodes 224. Such an example of an electrical connector and arrangement is seen and described in co-owned and assigned U.S. Pat. No. 5,886,866 issued Mar. 23, 1999 and is herein incorporated by reference.

Although various embodiments that incorporate the teachings of the present invention have been shown and described in detail herein, those skilled in the art can readily devise many other varied embodiments that still incorporate these teachings.

What is claimed is:

1. A semiconductor wafer support assembly comprising:
   a ceramic puck having a support surface;
   a composite cooling plate structure low temperature brazed to a bottom surface of the ceramic puck;
   a pedestal joining-ring, circumscribing the composite cooling plate structure and attached to the bottom surface of the ceramic puck; and
   a pedestal, electron-beam welded to the pedestal joining-ring.

2. The wafer support assembly of claim 1 wherein a diameter of the composite cooling plate structure is at least equal to a diameter of the support surface of the ceramic puck.

3. The wafer support assembly of claim 1 wherein the pedestal joining-ring is fabricated from an iron/nickel/cobalt alloy.

4. The wafer support assembly of claim 1 wherein the pedestal is fabricated from a material selected from the group consisting of stainless steel, aluminum, nickel, and a nickel alloy.

5. The wafer support assembly of claim 4 wherein the pedestal joining-ring is high temperature brazed to the bottom surface of the ceramic chuck.

6. The wafer support assembly of claim 4 wherein the composite cooling plate structure is fabricated from a material selected from the group consisting of an Al—Si—SiC composite, a zirconium alloy, aluminum nitride, an iron/nickel/cobalt alloy, a Si—SiC composite, molybdenum, and a molybdenum alloy.

7. The wafer support assembly of claim 1 wherein a transition layer is disposed between the bottom surface of the ceramic puck and the composite cooling plate structure.

8. The wafer support assembly of claim 1 further comprising a gas conduit ring high temperature brazed to the bottom surface of the ceramic puck.

9. The wafer support assembly of claim 8 further comprising a gas conduit electron-beam welded to the gas conduit ring.

10. The wafer support assembly of claim 9 wherein the gas conduit ring is fabricated from a material selected from the group consisting of an iron/nickel/cobalt alloy, nickel, molybdenum/iron/nickel/cobalt alloy, and copper.

11. The wafer support assembly of claim 1 further comprising a gas conduit ring high temperature brazed to a bottom surface of the composite cooling plate structure.

12. The wafer support assembly of claim 11 further comprising a gas conduit welded to the gas conduit ring.

13. The wafer support assembly of claim 11 wherein the gas conduit ring is fabricated from a material selected from the group consisting of an iron/nickel/cobalt alloy, nickel, molybdenum/iron/nickel/cobalt alloy, and copper.

14. The wafer support assembly of claim 1 further comprising a pair of cooling line rings high temperature brazed to a bottom surface of the composite cooling plate structure.

15. The wafer support assembly of claim 14 further comprising a pair of cooling lines respectively welded to the pair of cooling line rings.

16. The wafer support assembly of claim 14 wherein the pair of cooling line rings is fabricated from a material selected from the group consisting of an iron/nickel/cobalt alloy, nickel, molybdenum/iron/nickel/cobalt alloy, and copper.

17. A full area temperature controlled semiconductor wafer support assembly comprising:
a ceramic puck having a wafer support surface;
a composite cooling plate structure having a diameter at least equal to the wafer support surface, said composite cooling plate structure low temperature brazed to a bottom surface of the ceramic puck;
a pedestal joining-ring attached to a bottom surface of the composite cooling plate structure; and
a pedestal, electron-beam welded to the pedestal joining-ring.

18. The wafer support assembly of claim 17 wherein the composite cooling plate structure is fabricated from a material selected from the group consisting of molybdenum, a molybdenum alloy, and aluminum nitride.

19. The wafer support assembly of claim 18 wherein the pedestal joining-ring is high temperature brazed to the bottom surface of the composite cooling plate structure.

20. The wafer support assembly of claim 19 wherein the pedestal joining-ring is fabricated from a material selected from the group consisting of an iron/nickel/cobalt alloy, nickel, molybdenum/iron/nickel/cobalt alloy, and copper.

21. The wafer support assembly of claim 17 wherein the pedestal is fabricated from a metal material selected from the group consisting of stainless steel, aluminum, nickel, and a nickel alloy.

22. The wafer support assembly of claim 18 wherein a transition layer is disposed between the bottom surface of the ceramic puck and the composite cooling plate structure.

23. The wafer support assembly of claim 18 further comprising a gas conduit ring high temperature brazed to the composite cooling plate structure.

24. The wafer support assembly of claim 23 further comprising a gas conduit welded to the gas conduit ring.

25. The wafer support assembly of claim 23 wherein the gas conduit ring is fabricated from a material selected from the group consisting of an iron/nickel/cobalt alloy, nickel, molybdenum/iron/nickel/cobalt alloy, and copper.

26. The wafer support assembly of claim 18 further comprising a gas conduit ring high temperature brazed to the bottom surface of the ceramic puck.

27. The wafer support assembly of claim 26 further comprising a gas conduit welded to the gas conduit ring.

28. The wafer support assembly of claim 26 wherein the gas conduit ring is fabricated from a material selected from the group consisting of an iron/nickel/cobalt alloy, nickel, molybdenum/iron/nickel/cobalt alloy, and copper.

29. The wafer support assembly of claim 18 further comprising a pair of cooling line rings high temperature brazed to the bottom surface of the composite cooling plate structure.

30. The wafer support assembly of claim 29 further comprising a pair of cooling lines respectively welded to the pair of cooling line rings.

31. The wafer support assembly of claim 29 wherein the pair of cooling line rings is fabricated from a material selected from the group consisting of an iron/nickel/cobalt alloy, nickel, molybdenum/iron/nickel/cobalt alloy, and copper.

32. The wafer support assembly of claim 17 wherein the composite cooling plate structure is fabricated from a metal matrix composite Al—Si—SiC.

33. The wafer support assembly of claim 32 wherein the pedestal is fabricated from a metal material selected from the group consisting of stainless steel, aluminum, nickel, and a nickel alloy.

34. The wafer support assembly of claim 33 wherein the pedestal joining-ring is low temperature brazed to the bottom surface of the composite cooling plate structure.

35. The wafer support assembly of claim 33, wherein the composite cooling plate structure further comprises a cooling channel.

36. The wafer support assembly of claim 35 wherein a pair of cooling line rings is low temperature brazed to a bottom surface of the composite cooling plate structure and communicates with said cooling channel.

37. The wafer support assembly of claim 36 further comprising a pair of cooling lines respectively welded to the pair of cooling line rings.

38. The wafer support assembly of claim 33, wherein a gas conduit ring is low temperature brazed to a bottom surface of the composite cooling plate structure.

39. The wafer support assembly of claim 38 further comprising a gas conduit welded to the gas conduit ring.

40. The wafer support assembly of claim 33 further comprising a metalization layer disposed on the bottom surface of said ceramic puck.

41. The wafer support assembly of claim 40 wherein the composite cooling plate structure further comprises a transition layer disposed between the bottom surface of the ceramic puck and the composite cooling plate structure.

42. The wafer support assembly of claim 32 wherein the composite cooling plate structure further comprises a ratio of composite materials that match a thermal expansion coefficient for an iron/nickel/cobalt alloy at 600° C.

43. The wafer support assembly of claim 32, wherein the transition layer has a thermal expansion coefficient value in a range intermediate of respective thermal expansion coefficient values of said ceramic puck and said composite cooling plate structure.

44. A method of assembling a full area temperature controlled wafer support assembly including a puck having a support surface, wherein a diameter of a composite cooling plate structure is at least equal to a diameter of the support surface of the puck, comprising the steps of:
low temperature brazing the puck to the composite cooling plate structure; and
electron-beam welding the composite cooling plate structure to a pedestal.

45. The method of claim 44 further comprising the step of fabricating the puck from a material selected from the group consisting of aluminum nitride, silicon dioxide, silicon nitride, and alumina.

46. The method of claim 45, further comprising the step of fabricating the composite cooling plate structure from a material selected from the group consisting of zirconium, a zirconium alloy, and an iron/nickel/cobalt alloy.

47. The method of claim 46 further comprising the step of depositing a metalization layer on a bottom surface of said puck.

48. The method of claim 46 further comprising the step of disposing a transition layer, having a diameter approximately equal to the support surface diameter of the ceramic puck and the composite cooling plate structure diameter, between said puck and composite cooling plate structure.

49. The method of claim 48 further comprising the step of selecting the transition layer with thermal expansion coefficient value in a range that is intermediate with respect to thermal expansion coefficient values of the puck and the composite cooling plate structure.

50. The method of claim 48 further comprising the step of fabricating the transition layer from a metal matrix composite Al—Si—SiC.

51. The method of claim 50 wherein the step of fabricating the metal matrix composite further comprises the step of selecting a ratio of aluminum to silicon to define the thermal expansion coefficient of the transition layer.

52. The method of claim 51 wherein the step of selecting a ratio further comprises the step of selecting 30% Al—Si and 70% SiC.

53. A method of assembling a full area temperature controlled wafer support assembly, said assembly including a ceramic puck having a support surface, and a molybdenum-containing or aluminum nitride composite cooling plate structure having a diameter at least equal to a diameter of the support surface of the ceramic puck, comprising the steps of:
  disposing a gas conduit ring, a pair of cooling line rings, and a pedestal joining-ring on a bottom surface of the composite cooling plate structure;
  high temperature brazing the gas conduit ring, the pair of cooling line rings, and the pedestal joining-ring to the bottom surface of the composite cooling plate structure; and
  low temperature brazing a bottom surface of the ceramic puck to the composite cooling plate structure.

54. The method of claim 53 further comprising, prior to the low temperature brazing step, the steps of:
  welding a gas conduit to the gas conduit ring; and
  welding a pair of cooling lines to the pair of cooling line rings.

55. The method of claim 54 further comprising the step of electron-beam welding a pedestal to the pedestal joining-ring.

56. The method of claim 55 further comprising, prior to the electron-beam welding step, the step of providing electrical connections to the ceramic puck and composite cooling plate structure.

57. A method of assembling a wafer support assembly including a ceramic puck and a composite cooling plate structure, comprising the steps of:
  high temperature brazing a gas conduit ring and a pedestal joining-ring on a bottom surface of the ceramic puck; and
  low temperature brazing a bottom surface of the ceramic puck to the composite cooling plate structure.

58. The method of claim 57 wherein the composite cooling plate structure is fabricated from the materials selected from the group consisting of molybdenum, a molybdenum alloy, and aluminum nitride.

59. The method of claim 58 further comprising the step of high temperature brazing a pair of cooling line rings to a bottom surface of the composite cooling plate structure.

60. The method of claim 59 further comprising, prior to the low temperature brazing step, the steps of:
  welding a gas conduit to the gas conduit ring; and
  welding a pair of cooling lines to the pair of cooling line rings.

61. The method of claim 60 further comprising the step of electron-beam welding the pedestal joining-ring to a pedestal.

62. The method of claim 61 further comprising, prior to the electron-beam welding step, the step of providing electrical connections to the ceramic puck and composite cooling plate structure.

63. A method of assembling a wafer support assembly including a ceramic puck and a composite cooling plate structure, comprising the steps of:
  disposing a gas conduit ring, a pair of cooling line rings, and a pedestal joining-ring on a bottom surface of the composite cooling plate structure;
  disposing a bottom surface of the ceramic puck over the composite cooling plate structure; and
  low temperature brazing the gas conduit ring, the pair of cooling line rings, and the pedestal joining-ring to the bottom surface of the composite cooling plate structure, and the bottom surface of the ceramic puck to the composite cooling plate structure.

64. The method of claim 63 wherein the composite cooling plate structure is fabricated from a metal matrix composite material Al—Si—SiC.

65. The method of claim 64 further comprising, prior to the low temperature brazing step, the steps of:
  welding a gas conduit to the gas conduit ring; and
  welding a pair of cooling lines to the pair of cooling line rings.

66. The method of claim 65 further comprising the step of electron-beam welding a pedestal to the pedestal joining-ring.

67. The method of claim 66 further comprising, prior to the electron-beam welding step, the step of providing electrical connections to the ceramic puck and composite cooling plate structure.

68. The method of claim 44, wherein the composite cooling plate structure further comprises:
  a pedestal joining ring coupled to the puck and electron-beam welded to the pedestal.

69. The method of claim 68 further comprising:
  brazing the pedestal joining ring to the puck.

* * * * *

UNITED STATES PATENT AND TRADEMARK OFFICE
CERTIFICATE OF CORRECTION

PATENT NO. : 6,853,533 B2
DATED : February 8, 2005
INVENTOR(S) : Parkhe

It is certified that error appears in the above-identified patent and that said Letters Patent is hereby corrected as shown below:

Column 18,
Line 33, delete "chuck" and insert -- puck --.

Signed and Sealed this

Twenty-seventh Day of December, 2005

JON W. DUDAS
*Director of the United States Patent and Trademark Office*